United States Patent
Lin et al.

(10) Patent No.: US 6,674,778 B1
(45) Date of Patent: Jan. 6, 2004

(54) ELECTRICALLY PUMPED EDGE-EMITTING PHOTONIC BANDGAP SEMICONDUCTOR LASER

(75) Inventors: Shawn-Yu Lin, Albuquerque, NM (US); Walter J. Zubrzycki, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/044,488

(22) Filed: Jan. 9, 2002

(51) Int. Cl.$^7$ ................................................. H01S 5/00
(52) U.S. Cl. ............................................ 372/46; 372/45
(58) Field of Search .............................. 372/46, 45, 49; 257/98

(56) References Cited

U.S. PATENT DOCUMENTS

| | | | |
|---|---|---|---|
| 4,503,447 A | * 3/1985 | Iafrate et al. | 257/15 |
| 5,493,577 A | 2/1996 | Choquette et al. | |
| 5,682,401 A | 10/1997 | Joannopoulos et al. | |
| 5,684,817 A | * 11/1997 | Houdre et al. | 372/45 |
| 5,784,400 A | 7/1998 | Joannopoulos et al. | |
| 5,955,749 A | * 9/1999 | Joannopoulos et al. | 257/98 |
| 6,207,973 B1 | 3/2001 | Sato et al. | |
| 6,359,920 B1 | * 3/2002 | Jewell et al. | 372/46 |
| 6,438,150 B1 | * 8/2002 | Yoo | 372/49 |

OTHER PUBLICATIONS

1986 American institure P Sep. 1986 U.S. T.E. Schlesinger.*
Painter et al., "Two–Dimensional Photonic Band–Gap Defect Mode Laser," Science 284, 1819 (1999).
Zhou et al., "Electrically injected single–defect photonic bandgap surface–emitting laser at room temperature," Electronics Letters 36(18), 1541 (2000).
Chow et al., "Three–dimensional control of light in a two–dimensional photonic crystal slab," Nature 407, 983 (2000).
Kondow et al., "GaInNAs: A Novel Material for Long–Wavelength Semiconductor Lasers," IEEE J. of Selected Topics in Quantum Electronics 3(3), 719 (1997).
Zhou et al., "Characteristics of a Photonic Bandgap Single Defect Microcavity Electroluminescent Device," IEEE J. of Quantum Electronics 37(9), 1153 (2001).
Lee et al., "Photonic bandgap disk laser," Electronics Letters 35(7), 569 (1999).
Foresi et al., "Photonic–bandgap microcavities in optical waveguides," Nature 390, 143 (1997).
Ripin et al., "One–dimensional Photonic Bandgap Microcavities for Strong Optical Confinement in GaAs and GaAs/$Al_xO_y$ Semiconductor Waveguides," J. Lightwave Tech. 17(11), 2152 (1999).
Lin et al., "Direct measurement of the quality factor in a two–dimensional photonic–crystal microcavity," Optics Letters 26(23), 1903 (2001).
Schlesinger et al., "Determination of the interdiffusion of Al and Ga in undoped (Al,Ga)As/GaAs quantum wells," Appl. Phys. Lett. 49(9), 519 (1986).
Deppe et al., "Stripe–geometry quantum well heterostructure $Al_xGa_{x-4}As$–GaAs lasers defined by defect diffusion," Appl. Phys. Lett. 49(9), 510 (1986).

* cited by examiner

*Primary Examiner*—Paul Ip
*Assistant Examiner*—Hung T Vy
(74) *Attorney, Agent, or Firm*—Kevin W. Bieg

(57) ABSTRACT

A highly efficient, electrically pumped edge-emitting semiconductor laser based on a one- or two-dimensional photonic bandgap (PBG) structure is described. The laser optical cavity is formed using a pair of PBG mirrors operating in the photonic band gap regime. Transverse confinement is achieved by surrounding an active semiconductor layer of high refractive index with lower-index cladding layers. The cladding layers can be electrically insulating in the passive PBG mirror and waveguide regions with a small conducting aperture for efficient channeling of the injection pump current into the active region. The active layer can comprise a quantum well structure. The quantum well structure can be relaxed in the passive regions to provide efficient extraction of laser light from the active region.

17 Claims, 8 Drawing Sheets

ELECTRICALLY PUMPED EDGE-EMITTING PHOTONIC BANDGAP SEMICONDUCTOR LASER

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention relates to semiconductor lasers and more particularly, to an electrically pumped edge-emitting semiconductor laser based on one- or two-dimensional photonic bandgap structures.

With the growth of photonic technologies and integrated optics, semiconductor lasers have seen increasing use in optical telecommunications and other optoelectronic applications. Optical communications can require high-speed modulation of a light signal with low-loss transport over long distances, temporal coherence, and wavelength multiplexing. Furthermore, the ability to integrate multiple functions on the same monolithic device or chip may offer efficiency, reliability, and cost improvements over current discrete device functions for such applications. Current semiconductor laser sources have several shortcomings for use in such photonic integrated circuits.

Photonic crystal microcavities have been recently demonstrated that may enable low threshold lasers that operate at lasing wavelengths important for optical communications. Photonic crystals comprise periodic dielectric structures that have photonic bandgaps (PBGs) that prevent light with energy within the PBG from propagating in certain directions. An active medium can be introduced within the photonic crystal structure having a lasing frequency that lies within the PBG. The photonic crystal structure can thereby provide reflecting walls, forming a resonant optical cavity. The reflectivity of PBG mirrors can be controlled by engineering of the photonic crystal structure. Furthermore, if the spacing between the PBG reflectors is made very small, thereby forming a microcavity of the active medium, it is possible to increase the mode spacing of the microcavity such that only one mode falls within the emission linewidth of the active medium. Additionally, these PBG semiconductor lasers can have high cavity quality factors, Q, to reduce the emission linewidth and improve temporal coherence of the emitted light, thereby enabling many multiplexed signals to be carried on a single fiber for communications applications.

Painter et al. have described a laser microcavity formed from a single defect in a two-dimensional (2D) photonic crystal. O. Painter et al., "Two-Dimensional Photonic Band-Gap Defect Mode Laser," Science 284, 1819 (1999). Their optical microcavity consisted of a half wavelength-thick waveguide for transverse (vertical) confinement and a 2D photonic crystal mirror for lateral localization of the guided mode. The laser had an air-bridge geometry, wherein the waveguide slab was suspended in air so that air was the low-index cladding material. The microcavity laser was fabricated in indium gallium arsenic phosphide (InGaAsP) with optical gain provided by strained quantum wells with a peak emission wavelength of 1.55 $\mu$m. Pulsed lasing action was achieved by optical pumping with a semiconductor laser focussed on the defect microcavity. However, a high incident laser pump power of 6.75 mW was required, because of the relatively low quality factor (Q of about 250) of the defect mode, poor cooling of the waveguiding slab, and inefficient optical pumping.

Zhou et al. have reported a 2D-PBG defect mode surface-emitting laser with electrical current injection into an InGaAs p-n junction with lasing at 0.9 $\mu$m wavelength. Zhou et al. "Electrically injected single-defect photonic bandgap surface-emitting laser at room temperature," Electronics Letters 36(18), 1541 (2000). The defect mode had a high quality factor of about 1164, due to good lateral confinement by the 2D-PBG structure and a bottom distributed Bragg reflector mirror. The laser had a relatively low threshold current of 300 $\mu$A, due to efficient electrical pumping.

However, the surface-emitting semiconductor lasers of Painter et al. and Zhou et al. cannot be easily integrated with other optical components to provide a photonic integrated circuit. It is therefore an object of the present invention to provide a low-threshold, edge-emitting PBG semiconductor laser that can be efficiently pumped electrically, emits long-wavelength light, and can be easily integrated with other active and passive optical components. Stimulated emission can be achieved at a low threshold current in the semiconductor laser of the present invention, due to efficient carrier injection into the active region, good optical confinement, and efficient extraction of the emitted light. With a microcavity semiconductor laser of the present invention, cavity quality factors in excess of 1000 can be realized, enabling low threshold currents of tens of microamperes.

SUMMARY OF THE INVENTION

The present invention relates to an electrically pumped edge-emitting photonic bandgap semiconductor laser, comprising an active layer of semiconductor material defining a plane having an axial direction, comprising a periodic dielectric structure adapted to have a photonic bandgap, the periodic dielectric structure having an active region therein where the semiconductor material forms an active p-n junction having light emission at a lasing wavelength within the photonic bandgap; at least two cladding layers enclosing the active layer for optical confinement of the light emission to the axial direction; and a positive electrode connected to the p-type material and a negative electrode connected to the n-type material for electrical pumping of the active region to achieve light emission from the p-n junction in the axial direction of the semiconductor laser. The active region can further comprise an active p-i-n junction having a quantum well structure. The quantum well structure can be relaxed outside of the active region to enable efficient extraction of the emitted light. The at least two cladding layers can be electrically insulating cladding layers forming a current-carrying aperture therein having an axial dimension of less than the lasing wavelength within the semiconductor material to provide efficient carrier injection into the active region.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 3 shows an active region of an embodiment of the present invention comprising AlGaAs/GaAs.

DETAILED DESCRIPTION OF THE INVENTION

Photonic bandgap edge-emitting semiconductor lasers can have advantages over PBG surface-emitting and traditional edge-emitting semiconductor lasers, particularly for use with integrated optical devices. The optical cavity length defined by PBG mirrors can be very small to provide single-mode laser light output. The PBG mirror reflectivity can be tailored to achieve strong optical feedback. Furthermore, because such PBG edge-emitting semiconductor lasers rely on PBG structures for optical confinement, they do not require cleaved facets for cavity mirror feedback and can be fabricated anywhere on a chip. As a result, the edge-emitting PBG semiconductor laser of the present invention can be integrated with other optical components, such as waveguides, polarizers, beam-splitters, and modulators, to form a photonic integrated circuit on a single chip.

Figure 1:
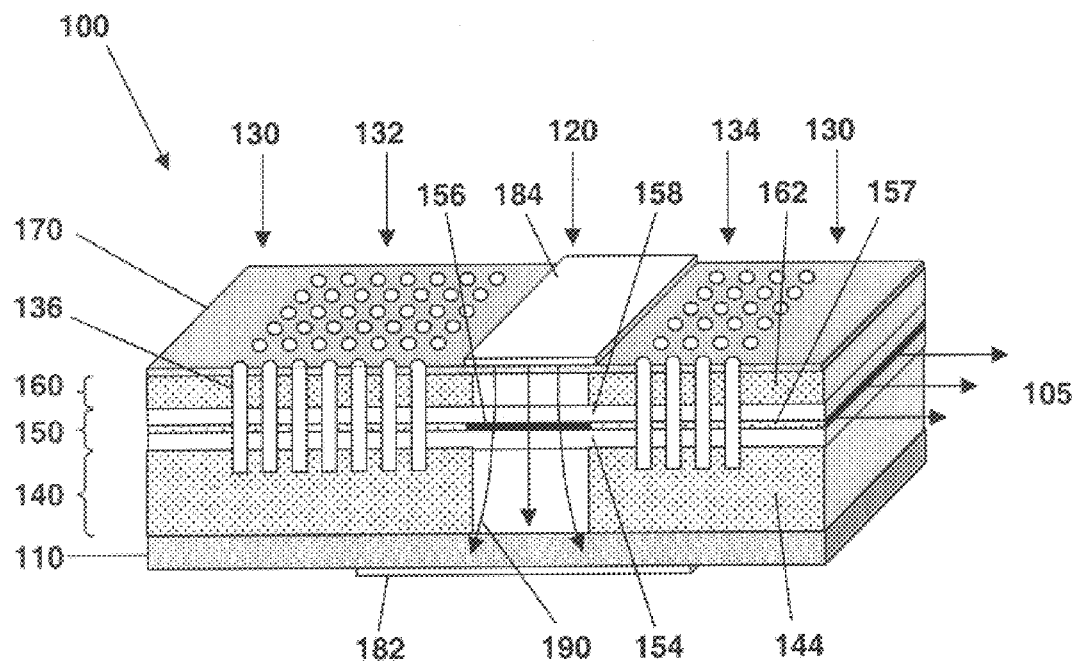
FIG. 1 shows a perspective schematic illustration of an electrically pumped edge-emitting photonic bandgap semiconductor laser.

FIG. 1 shows a schematic illustration of an electrically pumped edge-emitting PBG semiconductor laser 100 according to the present invention. The semiconductor laser 100 can have a layered structure, built up from a substrate 110, from which light 105 is emitted in an axial direction that is parallel to the plane of the layers. The semiconductor laser 100 can comprise an active region 120 for generation of the emitted light 105, a first PBG mirror 132 and a second PBG mirror 134 that define an optical cavity for axial confinement of the emitted light in the active region 120, and waveguide regions 130 for extraction of the light 105. The layered structure can comprise an active semiconductor material layer 150 and surrounding lower and upper cladding layers 140, 160 for transverse confinement of the light emitted from the active region 120. The layered structure can further comprise an upper contact layer 170 for deposition of an upper electrode 184 thereon for current injection into the active region 120. A lower electrode 182 can be provided to make electrical connection to the underside of the active region 120. The cladding layers 144, 162 in the PBG mirror regions 132, 134 and waveguide regions 130 can be of an electrically insulating material to provide good electrical confinement of the injected current 190 to the active region 120.

The active region 120 can comprise a bulk or quantum well active layer 150. The active layer 150 can be either undoped (i.e., intrinsic) or a portion on either side of a junction can be doped to form a semiconductor p-n or p-i-n junction within the active region 120. Preferably, the active layer 150 can comprise a p-i-n double-heterostructure junction, designed to provide sufficient optical gain for lasing action in the optical cavity for an operating current range of the semiconductor laser 100.

The p-i-n double-heterostructure junction can further comprise a thin carrier-confining quantum well layer 156 surrounded by intermediate bandgap barrier layers 154, 158 to aid in photon confinement. Light generated in the quantum well layer 156 is thereby tightly confined in the transverse direction because the bandgaps of the barrier layers 154, 158 and cladding layers 140, 160 are higher than that of quantum well layer 156. The quantum well layer 156 can be a strained quantum well (SQW) having a small lattice mismatch with the surrounding barrier layers 154, 158 Small amounts of strain are known to further reduce the density of states and lower the threshold current density of semiconductor lasers. The active layer 150 can comprise multiple quantum wells (not shown) or a single quantum well, as shown, to increase the optical gain.

Light generated in the active region 120 will have an evanescent field that penetrates into the PBG mirror regions 132, 134. In addition, a small percentage of the light can pass through the second PBG mirror 134 to be extracted through the waveguide 130 for light output 105 to a photonic integrated circuit or other optical device. For low threshold operation and efficient integration of the semiconductor laser 100 with other optical components, it is desirable that the passive mirror regions 132, 134 and waveguide regions 130 are transparent to the emitted light 105 in the axial direction. Therefore, the bandgap of the quantum well in the PBG mirror regions 132, 134 and the waveguide regions 130 should preferably be larger than that in the active region 120 to prevent the reabsorption of the axially emitted light in these passive regions. An increase in the quantum well bandgap can be achieved by intermixing of the of the quantum well and barrier layers to form a relaxed quantum well layer 157 in the passive regions.

The PBG mirrors 132, 134 can comprise periodic dielectric structures adapted to have a photonic bandgap at the lasing wavelength. The strength of the PBG mirrors 132, 134 can be tailored by varying the geometry and index contrast of the periodic dielectric structures. The resonant optical cavity formed by the PBG mirrors 132, 134 can be asymmetric with the first PBG mirror 132 having high reflectivity (preferably >99%) and the second PBG mirror 134 having a somewhat lower reflectivity (preferably about 95–99%) to provide for output of the emitted light 105 and to provide a high cavity quality factor. The periodic dielectric structure of the PBG mirrors 132, 134 can be an array of vertical dielectric-contrasting posts or air holes 136 perpendicular to the layered structure.

The emitted light can be guided vertically by strong index guiding and horizontally by index guiding or by a 2D photonic crystal bandgap. For transverse (vertical) confinement of the emitted light, perpendicular to the layered structure, the cladding layers 140, 160 can have a lower index of refraction than that of the active layer 150. Likewise, the semiconductor laser can have lateral strips of low index material (not shown) adjacent to the active layer 150 or additional PBG structures (not shown) in the plane of the layered structure for lateral (horizontal) confinement of the emitted light. Such lateral confinement in a waveguide-coupled 2D photonic crystal slab comprising a periodic dielectric array of holes in the 2D crystal plane has been demonstrated by Chow et al., "Three-dimensional control of light in a two-dimensional photonic crystal slab," Nature 407, 983 (2000), which is incorporated herein by reference. A rectangular waveguide capable of total internal reflection of the guided light is thereby realized.

For light generation having a few modes, the active region 120 can comprise a point defect in the periodic dielectric structure thereby providing a resonant microcavity of the active material having a localized electromagnetic mode. The microcavity can be capable of single-mode light emission at a lasing wavelength matched to the cavity mode wavelength.

Figure 2:
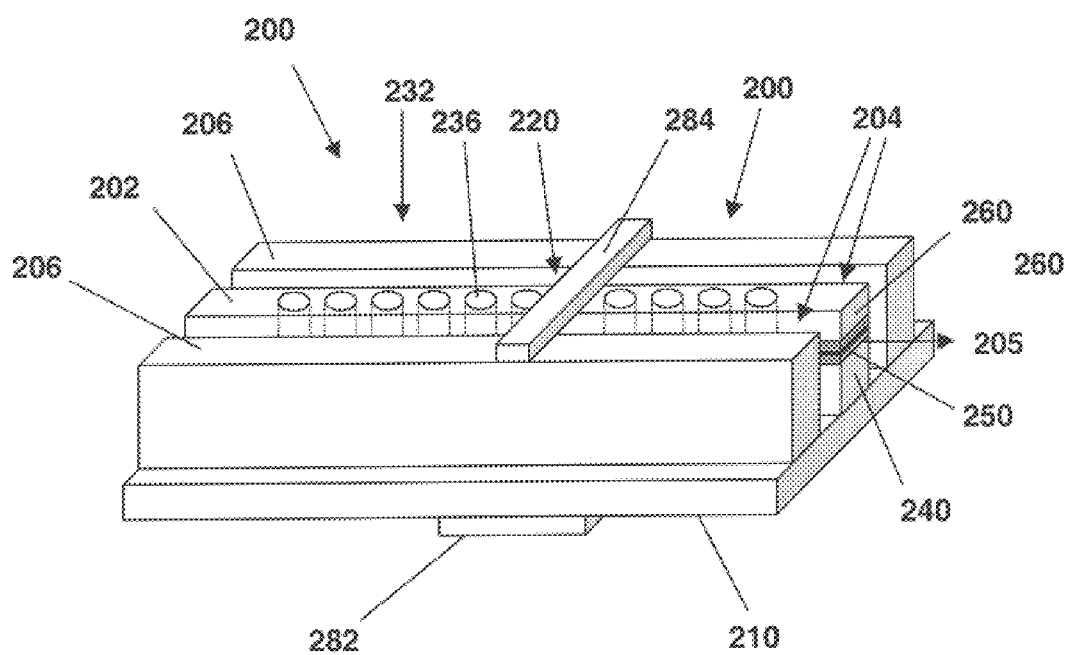
FIG. 2 shows a perspective schematic illustration of an electrically pumped 1D photonic bandgap microcavity semiconductor laser.

FIG. 2 shows an exemplary schematic illustration of an electrically pumped 1D PBG microcavity semiconductor laser 200 according to the present invention. The microcavity active region 220 can be a point defect comprising a missing hole in a 1D array of air holes 236, the holes forming 1D PBG mirrors 232, 234 through which laser light 205 can be extracted. The layered structure of the waveguided slab 202 can be similar to that of the 2D PBG semiconductor laser 100. Light can be confined transversely in the waveguided slab 202 by cladding layers 240, 260 and laterally by a air gaps 204 that provide high dielectric contrast to the active layer 250. Current contact to the microcavity active region 220 can be made through a conducting pinhole aperture (not shown) in the insulating upper cladding layer 260 by a floating point contact with an upper electrode 284. The upper electrode 284 can be supported by insulating columns 206 mounted from a substrate 210. A lower electrode 282 can provide electrical contact to the underside of the microcavity active region 220.

Active Region Layered Structure

The active region 120 can preferably be a quantum well structure having an active layer thickness comparable to the de Broglie wavelength of an electron or hole, but less than the critical thickness for the generation of misfit dislocations. Typically, this critical thickness is on the order of a few hundred angstroms or less. With a quantum well, stimulated emission results from radiative transitions between quantized energy levels in the conduction and valence bands of the semiconductor material. Lasing can occur at lower threshold currents than those of a bulk laser diode, because the density of states is reduced and the injected carrier distribution is localized near the quantized energy levels. For the embodiments of the invention, as least one quantum well layer can be formed from a group III–V or group II–VI semiconductor alloy such as GaAs, AlGaAs, InGaAsP, AlGaAsP, InGaAs, InAlGaAs, GaInNAs, GaInSbAs, or the like. The semiconductor alloy composition, layer thickness, and number of layers can be selected to provide a good lattice match to the surrounding barrier layers, thereby controlling strain effects, and to provide an appropriate index of refraction contrast for optical confinement of the light emitted from the active layer 150. The layers can be epitaxially grown by techniques known to those of ordinary skill in the art. These techniques include metal-organic chemical vapor deposition (MOCVD), molecular beam epitaxy (MBE), or the like.

Figure 3A:
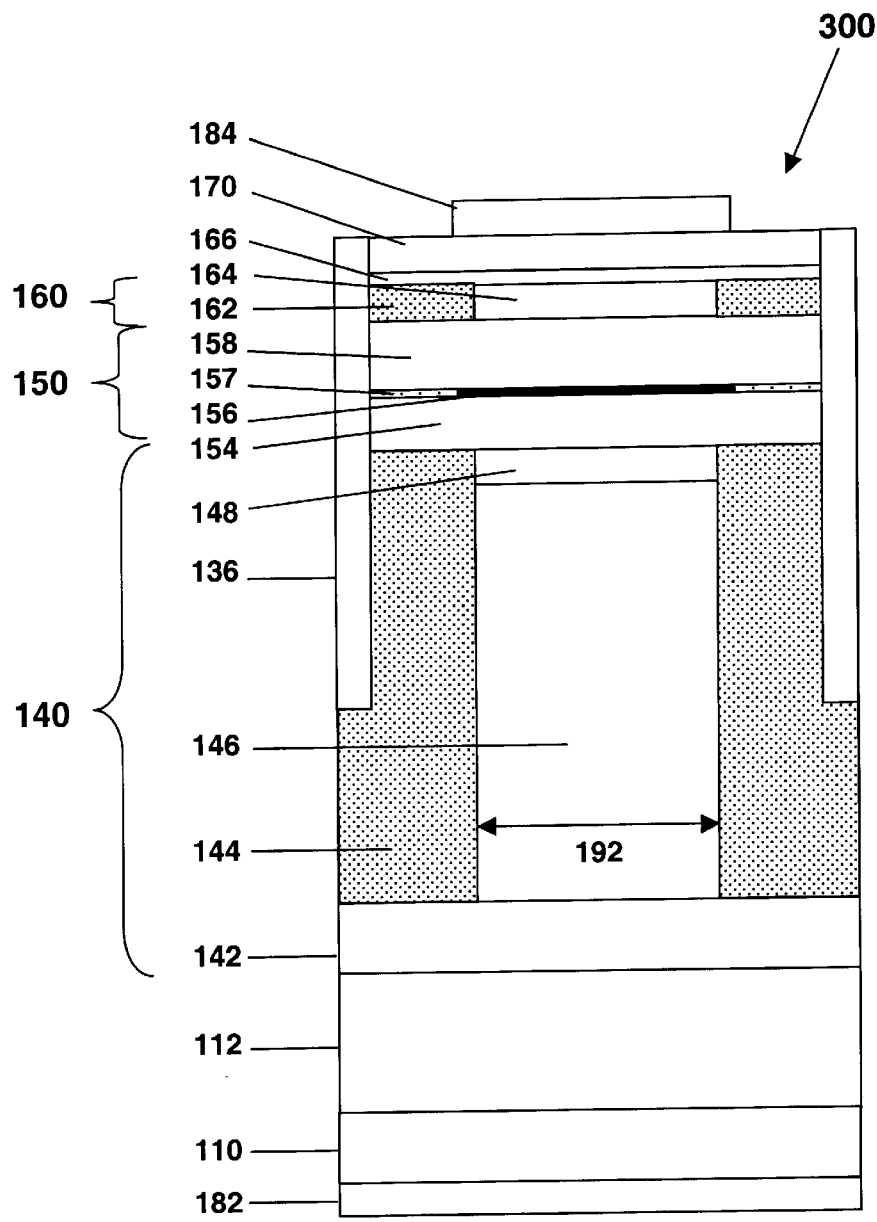
FIG. 3A shows a cross-sectional schematic illustration of the layered structure of the active region.
Figure 3B:
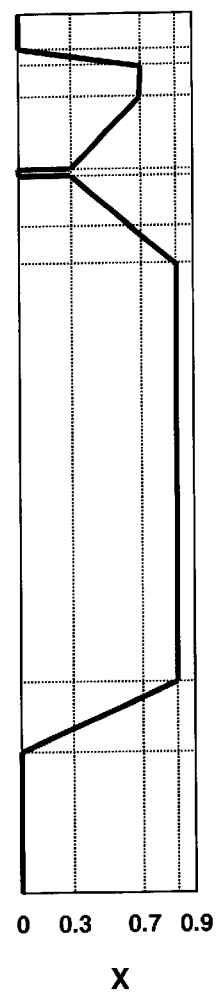
FIG. 3B shows an aluminum composition profile of the layered structure.

FIG. 3 shows an exemplary layered structure 300 of the present invention forming an AlGaAs/GaAs laser system. Aluminum gallium arsenide lasers emit light in the near-infrared and have many uses in optical communications systems, including as pump sources for fiber amplifiers. FIG. 3A shows a cross-sectional schematic illustration of the layered structure 300 in the active region 120. FIG. 3B shows an aluminum composition profile of the layered structure 300. The layered structure can be epitaxially grown on a GaAs substrate 110 by techniques known to those with ordinary skill in the art.

The GaAs substrate 110 can be doped, for example, n-type (e.g., $2\times10^{18}$ cm$^{-3}$ with an electron-donating impurity, or donor) to provide for contact with a negative electrode 182. A semiconductor buffer layer 112 having the same polarity as the substrate 110, such as a thin layer of n-type GaAs (e.g., 200 nanometers thickness doped with $2\times10^{18}$ cm$^{-3}$ donors), can be epitaxially grown on the substrate 110 prior to the deposition of the AlGaAs n-type cladding layers 140.

As an example, the n-type cladding layer structure 140 can comprise a first thin graded layer 142, followed by a thick Al-rich layer 146, followed by a second thin graded layer 148. The first graded layer 142 (e.g., 100 nanometers thickness) can be $Al_xGa_{1-x}As$ with the aluminum composition graded from x=0.0 on the GaAs buffer layer side to x=0.9 on the thick layer side. This graded layer 142 can be followed by the thick layer 146 (e.g., 2.0 micrometers thickness) of $Al_{0.90}Ga_{0.1}As$. The aluminum of the thick layer 146 can be later oxidized to provide an insulating cladding layer 144 in the passive regions outside of the active region 120. A conductive aperture 192 defined by the insulating cladding layer 144 optimizes electrical current confinement by channeling the electron current flow from the negative electrode 182 to the active region 120 and enhances optical confinement in the mirror regions 132, 134 and waveguide regions 130. The thick layer 146 can be followed by the graded layer 148 (e.g., 50 nanometers thickness) of $Al_xGa_{1-x}As$, graded from x=0.9 on the thick layer side to x=0.6 on the barrier layer side. The n-type cladding layers 140 can be doped with a donor (e.g., Si) to facilitate the flow of electrons in the active region 120. The dopant concentration can be higher in the outer cladding layers 142, 146 and reduced in the inner cladding layer 148 to reduce optical loss in the active layers 150 due to dopant impurity absorption and light scattering (e.g., $2\times10^{18}$ cm$^{-3}$ donors in layer 142, $1\times10^{18}$ cm$^{-3}$ in layer 146, and $0.5\times10^{17}$ cm$^{-3}$ in layer 148).

The active layer 150 can be a p-i-n double-heterostructure junction comprising a thin layer 156 of undoped active material sandwiched between an n-side barrier layer 154 and a p-side barrier layer 158. The barrier layers 154, 158 surrounding the one or more quantum well layers 156 preferably have an energy bandgap intermediate between the energy bandgap(s) of the quantum-well layer(s) 156 and the cladding layers 140, 160. As shown, the barrier layers 154, 158 can have a semiconductor composition that is graded in the growth direction, forming a graded-index separate confinement heterostructure (GRINSCH) active region 120. Alternatively, the semiconductor alloy composition of the barrier layers 154, 158 can be uniform in the growth direction, forming a separate confinement (SCH) active region 120. The barrier 154, 158 and cladding layers 140, 160 thereby define a transverse refractive index profile for index guiding of the light within the active 120, mirror 132, 134, and waveguiding 130 regions. The index guiding effect is strongest if the low-index cladding layers 140, 160 are closest to the light-generating quantum well layer 152, so the barrier layers 154, 158 are kept thin.

As an example, to form an edge-emitting laser 100 for light emission near 980 nanometers wavelength, the active layer 150 can be comprised of an undoped 7-nanometer-thick GaAs quantum-well layer 156 surrounded by undoped thin $Al_xGa_{1-x}As$ barrier layers 154, 158. Alternatively, the quantum well layer 156 can be a strained quantum well comprising $In_xGa_{1-x}As$. InAs has a larger lattice constant than GaAs, so that the incorporation of indium in the GaAs lattice structure increases the compressive strain from that of a lattice-matching quantum well and reduces the band-gap energy. On the n-type side of the quantum well layer 156, the n-side barrier layer 154 can comprise a 60-nanometer-thick graded layer of $Al_xGa_{1-x}As$, graded from x=0.6 on the n-type cladding side to x=0.3 at the quantum well layer 156. The p-side barrier layer 158 can comprise a 100-nanometer-thick graded layer of $Al_xGa_{1-x}As$ graded from x=0.3 at the quantum well layer 156 to x=0.7 on the p-type cladding layer side.

The p-type cladding layer structure can comprise a 60-nanometer-thick layer 164 of $Al_{0.7}Ga_{o.3}As$ on the p-side barrier layer 158 followed by a 20-nanometer thick $Al_xGa_{1-x}As$ graded layer 166, graded from x=0.7 on the active layer side to x=0.0 at the p-type contact layer 170. The p-type cladding layers 160 can be doped, for example, p-type with electron-accepting impurities (acceptors) to provide for hole current flow in the active region 120 (e.g., $1 \times 10^{18}$ cm$^{-3}$ acceptors in layer 164, and $2 \times 10^{19}$ cm$^{-3}$ in layer 166). Similarly to the n-type cladding layers 140, the aluminum of the p-type cladding layers 160 can be later oxidized to form an insulating layer 162 in the passive regions. The oxidized p-type cladding layers 162 define a conductive aperture to optimize electrical current confinement by channeling hole current flow from the positive electrode 184 into the active region 120 and enhance optical confinement in the passive regions. The p-type cladding layers 160 can be followed by a 50-nanometer-thick p-type GaAs (e.g., $2 \times 10^{19}$ cm$^{-3}$ acceptor dopant) to provide a contact layer 170 for metallization of the positive electrode 184.

Another example of a quantum well material suitable for the present invention is the newly developed GaInNAs/GaAs system. This material emits light at wavelengths of 1.3 μm or longer, important for light sources for optical communications in low-loss optical fiber. GaInNAs has improved temperature characteristics compared to other long-wavelength laser diodes due to a very deep quantum well with large conduction band offset, with consequent suppressed electron overflow. This deep quantum well also enables a large gain constant and efficient lasing even from a SQW. Kondow et al., "GaInNAs: A Novel Material for Long-Wavelength Semiconductor Lasers," IEEE Journal of Selected Topics in Quantum Electronics 3, 719 (1997) and U.S. Pat. No. 6,207,973 to Sato et al.

Quantum Well Relaxation

The cavity-confined emitted light from the active region 120 will have an evanescent field that penetrates into the PBG mirror regions 132, 134. To minimize the mirror loss and self-absorption of the output light 105 in the mirror 132, 134 and waveguide 130 regions, the quantum well structure can be relaxed to widen the electronic bandgap in these passive regions. Quantum well relaxation in the passive regions can be achieved by disordering the quantum well structure by quantum well intermixing (QWI). The vacancy-induced disordering method involves the creation and diffusion of a gallium vacancy to induce barrier and quantum well intermixing during high temperature annealing.

Figure 4:
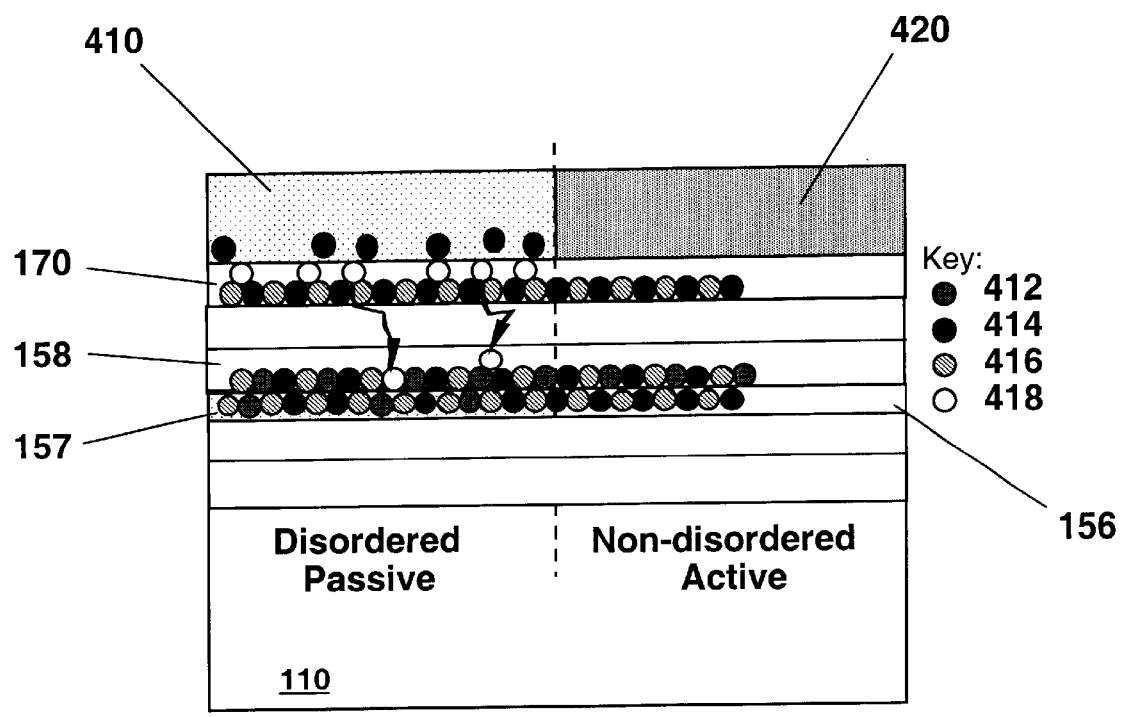
FIG. 4 shows a schematic illustration of vacancy-induced quantum well intermixing.

FIG. 4 illustrates vacancy-induced QWI in a GaAs quantum well layer (or InGaAs strained quantum well) surrounded by AlGaAs cladding and barrier layers. With vacancy-induced QWI, group III vacancies can be introduced into the p-side barrier layer 158. When annealed, the barrier layer vacancies can induce the intermixing of group III barrier layer atoms with the group III quantum well layer atoms. This intermixing of the barrier and quantum well atoms can disorder the quantum well layer 157 in the passive regions, thereby relaxing the quantum well structure and strain. A silicon dioxide ($SiO_2$) disorder mask 410 can be deposited on the GaAs contact layer 170 above the passive GaAs quantum well layer 157 that is to be disordered (labeled "disordered passive"). Ga atoms 414 from the GaAs contact layer 170 can diffuse into the $SiO_2$ disorder mask 410, leaving behind a gallium vacancy 418 in the GaAs contact layer 170. The vacancies 418 can thermally diffuse through the cladding layer to the barrier layer 158. Facilitated by the presence of the vacancies 418, the group III barrier atoms (e.g., Al 412 and Ga 414) can then intermix with the quantum well layer Ga atoms 414 by solid-state diffusion, thereby relaxing the quantum well structure in the passive regions underlying the $SiO_2$ disorder mask 410. Relaxation of the active quantum well layer 156 can be prevented by coating the GaAs contact layer 170 above the active region 120 with a silicon nitride (SiN) mask 420 (labeled "non-disordered active"). Gallium atoms have a lower diffusivity into the SiN mask 420 from the contact layer 170, thereby inhibiting vacancy formation in the GaAs contact layer 170. As a result, vacancy-induced intermixing of the barrier layer 158 with the active quantum well layer 156 underlying the SiN mask 420 does not occur, preventing significant relaxation of the quantum well during annealing.

Figure 5:
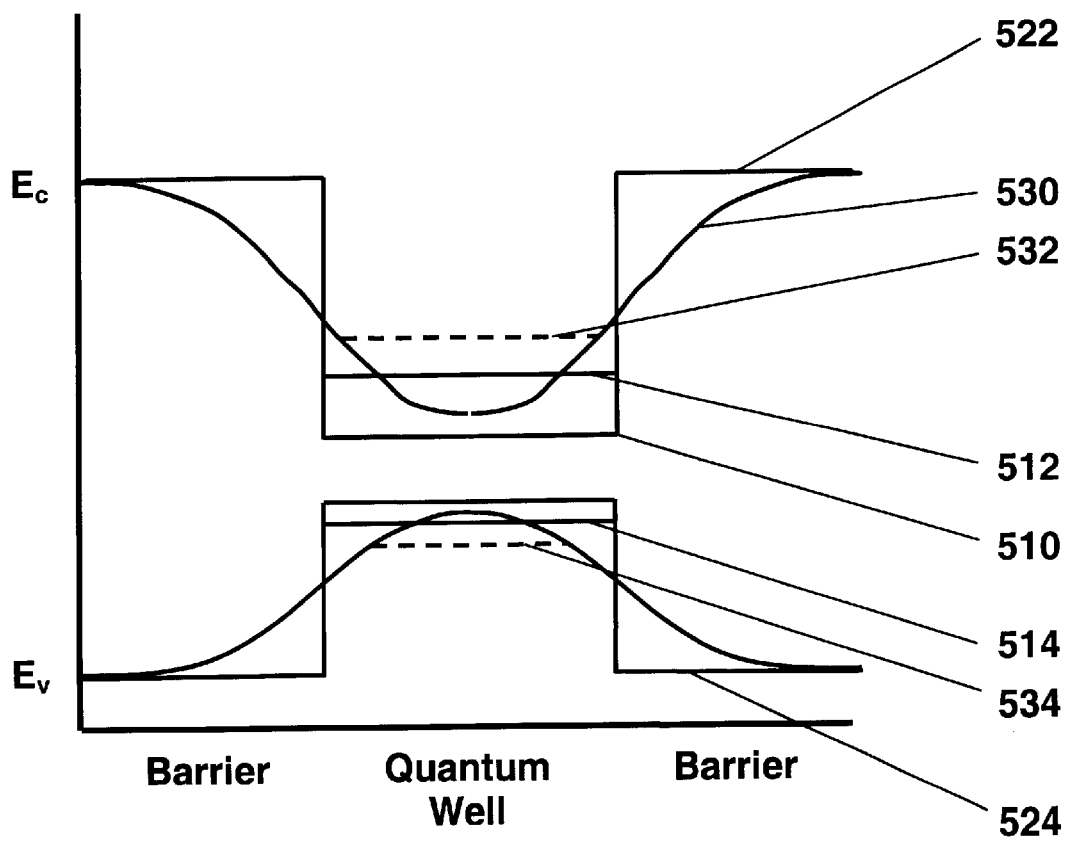
FIG. 5 shows an energy level diagram of a quantum well before and after disordering by quantum well intermixing.

FIG. 5 shows energy level diagrams of a quantum well before annealing 510 and after annealing 530 with vacancy-induced QWI of the quantum well structure. Prior to annealing, the quantum well 510 displays a sharp boundary with the barrier layer. The pre-annealed quantum well 510 has quantized energy levels for electrons 512 and holes 514 that are offset from the conduction 522 and valance bands 524 of the barrier layer material. The quantized energy levels 512, 514 of the unannealed quantum well layer 156 thereby have a transition energy that is less than the bandgap of the surrounding barrier layers 154, 158. After annealing with vacancy-induced QWI, the post-annealed quantum well 530 is relaxed due to intermixing of the quantum well layer 157 with the barrier layers 154, 158. The band offsets are reduced and the post-annealed quantized energy levels 532, 534 are relaxed towards the conduction 522 and valance bands 524 of the barrier layer material. Therefore, the post-annealed quantized energy levels 532, 534 will have a transition energy that is greater than the transition energy of the unannealed quantized energy levels 512, 514.

Figure 6:
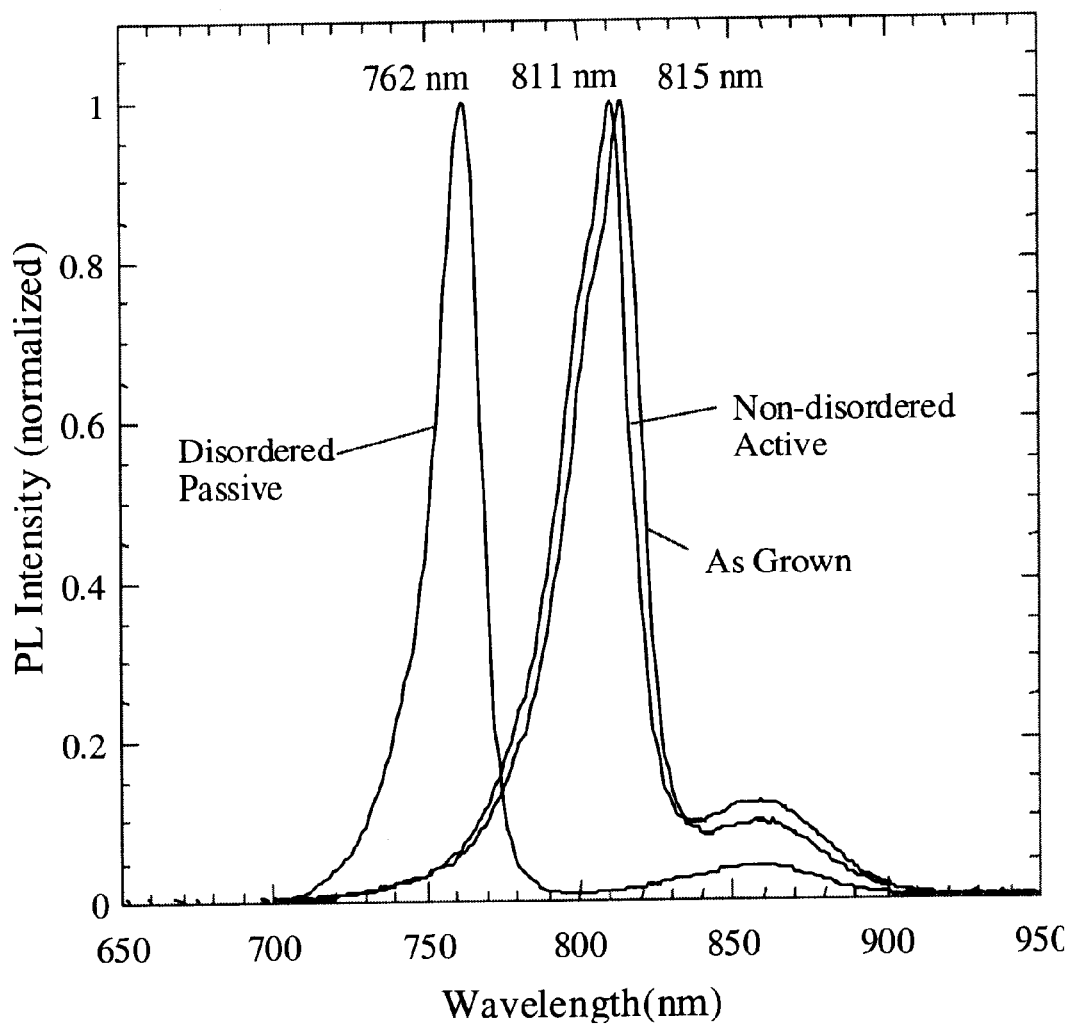
FIG. 6 shows a photoluminescence emission spectra of a quantum well as-grown, after annealing but without quantum well intermixing, and after annealing with vacancy-induced quantum well intermixing.

FIG. 6 shows photoluminescence emission spectra of a GaAs quantum well annealed with a $SiO_2$ disorder mask 410 above the passive quantum well layer 157 (labeled "disordered passive") and another GaAs quantum well annealed but with a SiN mask 420 above the active quantum well layer 156 (labeled "non-disordered active"). Also shown is a photoluminescence spectrum of the as-grown and not annealed GaAs quantum well layer (labeled "as grown"). The photoluminescence spectrum from the annealed active quantum well layer 156 underlying a SiN mask (labeled "non-disordered active") is only slightly blue-shifted to higher energy from the photoluminescence spectrum from the as-grown quantum well layer (labeled "as-grown"), indicating that only insignificant relaxation has occurred during annealing. However, the photoluminescence spectrum from the disordered passive quantum well layer 157 (labeled "disordered passive") is blue-shifted by 53 nanometers from the as-grown spectrum, indicating that significant intermixing of the AlGaAs barrier layer and GaAs quantum well layer 157 has occurred. Because the resulting quantized energy states in the passive disordered quantum well are spread further apart (by about 100 meV) by disordering than those in the active annealed quantum well, light emitted from the active quantum well layer 156 in the active region 120 will be transmitted through the disordered quantum well layer. 157 the passive PBG mirror 132, 134 and waveguide regions 130 without being reabsorbed. Propagation losses of less than 2 dB/cm can be achieved by vacancy-induced QWI in the AlGaAs/GaAs system.

After the layered structure 300 is grown, the quantum well in the passive regions can be disordered to increase the bandgap according to the vacancy-induced QWI mechanism described above. The p-type contact layer 170 in the mirror regions 132, 134 and waveguide regions 130 can be coated with a 200-nanometer-thick $SiO_2$ disorder mask by plasma-enhanced chemical vapor deposition (PECVD). To prevent disordering of the quantum well in the active region 120, the contact layer 170 in the active region 120 can be coated with a 200-nanometer-thick mask of SiN by PECVD. Vacancy diffusion and quantum well disordering in the passive regions can be achieved by rapid thermal annealing of the masked layer structure at about 900° C. for 2–4 minutes. After the rapid thermal anneal, the $SiO_2$ disorder mask and the SiN mask can be removed by dry etching in a $CF_4/O_2$ plasma.

Optical Cavity PBG Mirrors

Figure 7:
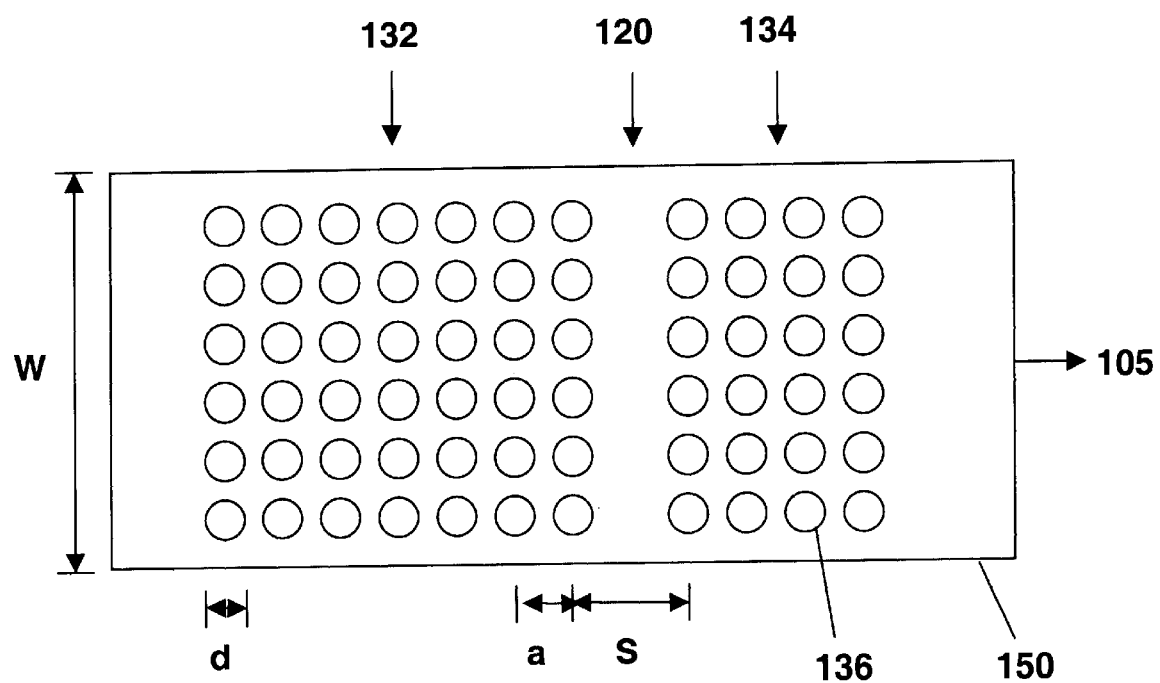
FIG. 7 shows a top view of a photonic bandgap structure comprising vertical air holes in the layered structure.

FIG. 7 shows a top view of 2D PBG mirrors 132, 134 forming a resonant optical cavity in the active region 120. The PBG mirrors 132, 134 can comprise periodic dielectric structures adapted to have a photonic bandgap. Axial confinement of the guided wave is achieved by destructive interference of multiple scattered waves of the emitted light in the periodic dielectric structure. Various periodic dielectric structures known to those in the ordinary art can provide PBG mirrors 132, 134 having a photonic bandgap at the lasing wavelength. The periodic structure of the PBG mirrors 132, 134 can be an array of vertical dielectric-contrasting posts (not shown) or air holes 136 perpendicular to the layered structure 300. The strength of the reflectivity of the PBG mirrors 132, 134 is determined by the geometry and number of vertical holes 136 in the propagation direction of the emitted light 105. The holes 136 can extend through both the active layer 150 and cladding layers 140, 160 to improve the optical confinement of the guided mode. The holes 136 can be formed in the layered structure 300 by means known to those in the art, including photolithography, x-ray lithography, electron beam lithography, or reactive ion beam etching.

The PBG structure can be designed to provide a mid-gap frequency equal to the lasing wavelength. For a thin 2D slab (where the slab thickness, t, is much less than the lattice constant, a) and a hole diameter of d~0.3λ, the mid-gap lo frequency will be about v~0.3 c/a. Equating the mid-gap frequency to the lasing wavelength, the hole diameter can be about d=0.7a=0.21λ. Thus, for a lasing wavelength of λ=830 nanometers, the lattice constant can be a~250 nanometers and the hole diameter can be d~170 nanometers. According to the previously cited reference by Chow et al., the attenuation in such a PBG structure can be about 4 dB/period. Thus, four lattice periods will provide a PBG mirror reflectivity of about 95%.

The modal character of the laser light 105 is determined by the cavity geometry consisting of the two end PBG mirrors 132, 134 and the active region 120. The modes satisfy the Fabry-Perot phase condition $$m(\lambda/n)=2S$$

where the cavity spacing S is the center-to-center distance (neglecting the evanescent field penetration) between the holes 136 on either side of the active region 120, m is the mode number, n is the refractive index in the active region 120, and λ is the lasing wavelength in vacuum. Referring now to FIG. 2., a microcavity 220 supporting only a few modes can be formed in the active layer 150 by the absence of a vertical hole in an otherwise continuous 1D PBG hole array. For lasing at λ=830 nanometers, the periodic holes can have the same dimensions as described above. To support a single mode, the cavity spacing can be S=140 nanometers. The lateral dimension W of the 1D waveguiding slab 202 can also be 140 nanometers to provided lateral localization of the single mode.

Electrical Current Injection

A very high density of injected carriers is required for population inversion and efficient lasing by stimulated emission with a typical heterojunction active layer 150. Referring now to FIG. 1, the cladding layers 144, 162 in the PBG mirror regions 132, 134 and waveguide regions 130 can be of an electrically insulating material to provide good electrical confinement of the injected current 190 to the active region 120. The cladding layers in the passive regions 144, 162 can be an oxide of the semiconductor material used to grow the cladding layers 140, 160. The high resistivity or current-blocking nature of the oxide cladding layers 144, 162 directs the flow of carrier current 190 through the oxide-free portion of the cladding layers 140, 160 and into the central portion of the active region 120. By channeling the current 190 into the active region 120 only, efficient majority carrier injection from the n-type semiconductor layers 140 and minority carrier injection from the p-type semiconductor layers 160 into the intrinsic active layer 150 can thereby be achieved. In addition, the oxide cladding 144, 162 increases optical confinement in the passive regions due to the substantially lower refractive index (n~1.45) of the oxide, as compared to the central active semiconductor layer material (n~3.5).

The cladding layers 140, 160 can have a semiconductor alloy composition that allows controlled lateral oxidation of a thin layer. $Al_xGa_{1-x}As$ has a strong compositional dependence of lateral oxidation for x in the range of about 0.8 to 1.0, as described by Choquette et al. in U.S. Pat. No. 5,493,577, which is incorporated herein by reference. Wet oxidation can be carried out by heating the Al-rich cladding layer to a high temperature under a controlled environment having high humidity. For example, $Al_{0.80}Ga_{0.20}As$ can have a lateral oxidation rate of about 20 nm per minute at an ambient temperature of T=440° C.

The cladding layers 144, 162 in the passive regions can be wet oxidized from the layer sidewalls and can have a lateral shape that depends on the number of sidewalls exposed to the oxidation process, oxidation conditions, and semiconductor alloy composition of the cladding layers 140, 160. By carefully controlling the oxidation rate, the oxidized layers 144, 162 can thereby be shaped to provide means for controlling the electrical and optical characteristics of the semiconductor laser 100. The current-carrying aperture 192 defined by the insulating cladding layers 144, 162 can have circular, rectangular, or other cross-section. The aperture cross-section can have a dimension in the axial direction that is small compared to the wavelength of the laser light 105, yet large compared to the electron wavefunction extent to enable good optical confinement and efficient electrical pumping of the active layer 150 in the active region 120. Preferably, the aperture 192 can have an opening of axial dimension less than the wavelength of the mode within the active semiconductor material (λ/n) and, more preferably, less than half of this wavelength. Such a small injection aperture 192 does not significantly affect the mode characteristics of the microcavity.

Figure 8:
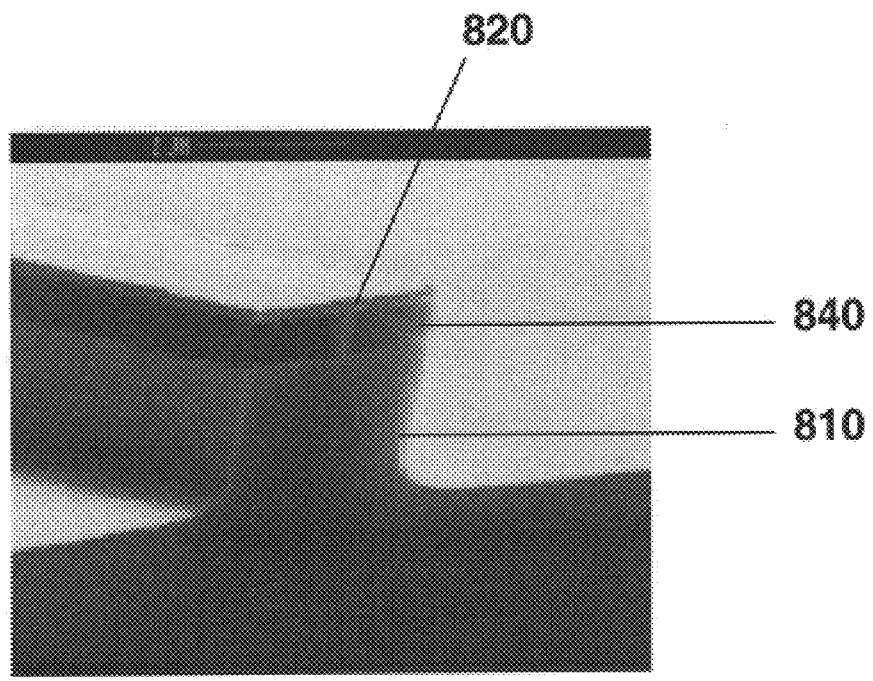
FIG. 8 shows a scanning electron micrograph of an oxidized AlGaAs layer grown on a GaAs substrate.

The aperture 192 in the cladding oxide can be small, on the order of 50–100 nanometers in cross-section, by proper control of the oxidation process. FIG. 8 shows a scanning electron micrograph image of a longitudinal conduction channel 820 that was formed by lateral oxidation of a thin $Al_{0.8}Ga_{0.2}As$ layer grown on a GaAs substrate 810. The dark regions are the oxidized layer 840. The light colored channel 820 of about 100 nanometers width is the unoxidized region.

Electrode Metallization

After the oxidation process is completed, an insulation layer can be deposited or spun onto the layered structure to protect and passivate the exposed semiconductor layers and to planarize the layered structure formed on the substrate. The insulation material can be formed of any insulating material as commonly used in the art including polyimides, spin-on glasses, silicon dioxide, silicon nitride, and the like.

To electrically contact the semiconductor laser 100, positive electrode 184 can be deposited on the p-type GaAs contact layer 170 and the negative electrode 182 can be deposited underneath the n-type GaAs substrate 110. A window can be opened in the planarized insulation layer (not shown) above the active region 120. An upper electrode 184 can be deposited through the insulation material to form electrical contact to the p-type GaAs contact layer 170. Likewise, the lower electrode 182 can be formed by depositing a patterned or full-surface metallization on the underside of the n-type GaAs substrate 110. After deposition, the metallizations can be annealed to form electrical contacts to the semiconductor laser.

Referring now to FIG. 2, since the current-carrying aperture (not shown) of the 1D PBG microcavity laser 200 is very small, floating point contact to the microcavity active region 220 is desirable. After the layered structure is oxidized, an insulation layer can be spun onto the substrate 210 to protect and passivate the etched waveguiding slab 202 and the exposed semiconductor layers, planarize the layered structure, and provide support for the upper electrode 184.

The embodiments of the present invention have been described as electrically pumped edge-emitting photonic bandgap semiconductor lasers. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An electrically pumped edge-emitting photonic bandgap semiconductor laser, comprising an active layer of semiconductor material defining a plane having an axial direction, the active layer comprising an array of dielectric-contrasting posts or holes having one-dimensional periodicity aligned substantially perpendicular to the plane of the active layer thereby providing a photonic bandgap, the periodic dielectric structure having an active region therein where the semiconductor material forms an active p-n junction having light emission and lasing wavelength within the photonic bandgap, the periodic dielectric structure providing a first photonic bandgap mirror and a second photonic bandgap mirror that define an optical cavity for axial confinement of the emitted light in the active region;

at least two air gaps surrounding the active layer for optical confinement of the light emission in the lateral direction;

at least two cladding layers enclosing the active layer for optical confinement of the light emission to the axial direction; and a positive electrode connected to the p-type material and a negative electrode connected to the n-type material for electrical pumping of the active region to achieve light emission from the p-n junction in the axial direction of the semiconductor, laser.

2. The semiconductor laser of claim 1, wherein the active region further comprises a semiconductor material forming an active p-i-n junction.

3. The semiconductor laser of claim 2, wherein p-i-n junction comprises a quantum well structure.

4. The semiconductor laser of claim 3, wherein the quantum well material comprises group III–V or group II–VI semiconductor material.

5. The semiconductor laser of claim 3, wherein the quantum well material is selected from the group of semiconductor alloys consisting of GaAs, AlGaAs, InGaAsP, AlGaAsP, InGaAs, InAlGaAs, GaInNAs, and GaInSbAs.

6. The semiconductor laser of claim 1, wherein the at least two cladding layers have indices of refraction less than the index of refraction of the active layer.

7. The semiconductor laser of claim 1, wherein the at least two cladding layers comprise oxides of semiconductor material.

8. The semiconductor laser of claim 7, wherein the oxide comprises an oxide of AlGaAs.

9. The semiconductor laser of claim 1, wherein the periodic dielectric structure supports a single optical mode within the active region.

10. An electrically pumped edge-emitting photonic bandgap semiconductor laser, comprising an active layer of semiconductor material defining a plane having an axial direction, the active layer comprising an array of dielectric-contrasting posts or holes having two-dimensional periodicity aligned substantially perpendicular to the plane of the active layer thereby providing a photonic bandgap, the periodic dielectric structure having an active region therein where the semiconductor material forms an active p-n junction having light emission at a lasing wavelength within the photonic bandgap, the periodic dielectric structure providing a first photonic bandgap mirror and a second photonic bandgap mirror that define an optical cavity for axial confinement of the emitted light in the active region;

at least two electrically insulating cladding layers, comprising oxides of the semiconductor material, enclosing the active layer for optical confinement of the light emission to the axial direction; and a positive electrode connected to the p-type material and a negative electrode connected to the n-type material by a current-carrying aperture in the at least two electrically insulating cladding layers for electrical pumping of the active region to achieve light emission from the p-n junction in the axial direction of the semiconductor laser.

11. The semiconductor laser of claims 10, wherein the aperture has a cross-section with axial dimension of less than the lasing wavelength within the active semiconductor material.

12. The semiconductor laser of claim 10, wherein the aperture has a cross-section with axial dimension of less than one-half of the lasing wavelength within the active semiconductor material.

13. An electrically pumped edge-emitting photonic bandgap semiconductor laser, comprising an active layer of semiconductor material defining a plane having an axial direction, the active layer comprising an array of dielectric-contrasting posts or holes having two-dimensional periodicity aligned substantially perpendicular to the plane of the active layer thereby providing a photonic bandgap, the periodic dielectric structure having an active region therein where the semiconductor material forms an active p-n junction having light emission at a lasing wavelength within the photonic bandgap, the periodic dielectric structure providing a first photonic bandgap mirror and a second photonic bandgap mirror that define an optical cavity for axial confinement of the emitted light in the active region;

at least two electrically insulating cladding layers enclosing the active layer for optical confinement of the light emission to the axial direction;

a positive electrode connected to the p-type material and a negative electrode connected to the n-type material by a current-carrying aperture in the at least two electrically insulating cladding layers for electrical pumping of the active region to achieve light emission from the p-n junction in the axial direction of the semiconductor laser; and wherein the electronic bandgap energy of the semiconductor material in the active layer outside of the active region is larger than the transition energy of the semiconductor material in the active region at the lasing wavelength.

14. The semiconductor laser of claim 13, wherein the active region further comprises a semiconductor material forming an active p-i-n junction.

15. The semiconductor laser of claim 14, wherein p-i-n junction comprises a quantum well structure.

16. The semiconductor laser of claim 15, wherein the quantum well structure is relaxed outside of the active region.

17. The semiconductor laser of claim 16, wherein the quantum well structure is relaxed outside of the active region by vacancy-induced quantum well intermixing.

* * * * *